United States Patent [19]
Hahn et al.

[11] Patent Number: 5,568,365
[45] Date of Patent: Oct. 22, 1996

[54] HIGH OUTPUT, COMPACT POWER SUPPLY

[75] Inventors: Stan S. Hahn, Moraga; Sung K. Baek, Martinez, both of Calif.

[73] Assignee: Asian Micro Sources, Inc., Moraga, Calif.

[21] Appl. No.: 241,111

[22] Filed: May 11, 1994

[51] Int. Cl.⁶ .................................................. H05K 7/00
[52] U.S. Cl. ........................... 361/837; 361/752; 361/828
[58] Field of Search ................................. 361/752, 796, 361/836, 837, 748, 828, 827; 174/50; 323/318

[56] References Cited

U.S. PATENT DOCUMENTS

5,297,025   3/1994   Shoquist et al. .................. 361/704

Primary Examiner—Leo P. Picard
Assistant Examiner—Y. Whang
Attorney, Agent, or Firm—Adam H. Tachner; Crosby, Heafey, Roach & May

[57] ABSTRACT

A compact power supply features a package with an included volume of less than about 250 cubic centimeters, a switching power supply contained in the package, the power supply capable of providing more than about 10 watts of power, and connections from input power to and for output from the power supply. The power supply can be configured on three circuit boards, in a U-shaped configuration. The boards may be partially or fully potted to provide improved thermal performance and safety. The electronic components are carefully selected and matched for maximum output performance.

14 Claims, 4 Drawing Sheets

HIGH OUTPUT, COMPACT POWER SUPPLY

FIELD OF THE INVENTION

The present invention relates generally to a high-efficiency, compact universal AC input, switching power supply.

BACKGROUND OF THE INVENTION

People in today's world rely heavily on a wide variety of electrical devices. Almost all of these devices draw power ultimately from a commercial source, usually delivered to the user through a wall outlet or socket. Most wall sockets have two (duplex) or four (quad) adjacent plugs.

A large number of these devices require a low voltage DC power input, typically available through a power supply. The required power supplies tend to be large, even those for providing small current outputs. Unfortunately, most small power supplies are too bulky to be plugged into a wall socket and still allow room for other devices, even simple plugs but also including other power supplies, to be plugged into the same wall socket.

A wide variety of modem devices need only a low-output power supply, typically up to 20 W with output voltages of 3.3, 5, 12, 21 and 24 VDC. Modem telephones, answering machines, radios, recording machines, facsimile machines, computer accessories such as modems, and many others are designed without internal power supplies and instead rely on an external power supply. Another large class of electrical devices is various portable electrical devices that use rechargeable batteries. For many devices, such as portable phones, electronic cameras, video games, calculators, tape players, and the like, a battery is or can be fitted within the device itself. For some devices, the battery can be removed easily, while in other devices, the battery is not designed to be removed.

A variety of power supplies and battery chargers are available for use with such devices. In general, a manufacturer provides a power supply or battery charger specifically designed for use with one or more products. Traditionally, the power supplies or battery chargers are bulky devices, often weighing 500 grams or more. The specific size of the battery charger is determined by a number of factors, including power to be delivered during product use or recharging and the presence or absence of special circuitry, for example to monitor the state of charge of a battery.

In one typical configuration, a power cord goes between the power supply and a wall socket, with a second power cord extending between the power supply and the electrical device. In another typical configuration, the power supply is built into a module which is designed to be plugged directly into a wall socket, with a single cord connecting the power supply to the battery. Traditional wall-mounted power supply modules have been relatively large. However, even the new, smaller wall-mounted power supplies provide only limited power or are too large for many applications.

Many power supplies or battery chargers are designed to be wall-mounted simply by virtue of plugging into a wall socket. A typical device includes a casing which terminates in a plug which is designed to plug directly into the wall socket. The casing is often designed to lie against a wall to provide mechanical stability and to maintain the plug prongs in proper contact with the wall socket.

Current wall adapters suffer from some significant problems. The most important is that the adapters are bulky and cover more than a single wall socket. In addition, the weight of current adapters can be a problem, especially when several adapters are plugged into a multi-outlet power strip.

Unfortunately, electrical plugs have an orientation and various power supplies are designed to extend in different directions relative to the plug. For example, a traditional American plug has two, parallel flat prongs, with the neutral prong slightly wider than the hot prong, plus, for many plugs, a cylindrical ground lead positioned relative to the flat prongs to form a triangle. Wall sockets are usually installed with the ground socket below the prong sockets, but this orientation is sometimes altered. Most power supplies are designed so the bulk of the device extends away from the plane of the two prongs in the direction of the ground lead, but others have the opposite orientation and a few are rotated by 90°.

The problem is accentuated in that most power supplies have a power cord running from the power supply for some distance to an adapter plug or an electrical device and this cord is normally positioned perpendicular to and pointing away from the plane defined by the two main prongs. This extends still farther the area covered by the power supply.

Few, if any, power supplies position the bulk of the device parallel to the prongs (extending away from the wall in a typical installation) because this would result in a large mass on a long lever arm. Since most plug devices are designed to be secured by spring tension and interaction with a wall plug, this can pose a significant mechanical disadvantage. The increased lever arm will tend to shift the plug downward, tending to pry the plug out of the wall socket. Angling the plug severely can compromise the electrical connection to the point that the plug no longer is in electrical contact with source current. This type of angling may lead to partial separation from the wall socket and may expose the prongs of the plug in such a way that a person, or even an animal, might come into contact with live current, thereby causing bodily harm.

These problems arise because previously available power supplies simply could not be built to provide enough power and also to fit within a small package, for instance in the general shape of a conventional plug.

The specifics of internal electronics have been less of a problem, at least in terms of providing necessary electronic functions. There is no world standard for power supply voltage or frequency, but since many electronic devices, and essentially all battery powered electrical devices, ultimately run on direct current, it is not too difficult to design a "universal" power supply that converts 100–240 volts AC at 50–60 Hertz into a direct current suitable for a particular application. Thus, industry has been able to address the power component and provide universal solutions. The size and bulk of power supplies, however, remain a problem.

Typical existing wall adapters utilize some form of electronic voltage regulation. The general techniques are well known in the art. The cheapest form of regulation is linear, typically using a series regulator or shunt regulator. The bulk, weight and substantial heat dissipation requirements of linear regulators are well known. For certain applications, a switching power supply may be useful, but such supplies require careful engineering to avoid conducted and radiated RFI. In addition, switching power supplies are prone to subtle failure modes that may be difficult to predict or analyze.

Linear regulated power supplies have distinct drawbacks over the more sophisticated switching power supplies. Firstly, a linear power supply requires a 50–60 Hz transformer to step down the AC voltage. The size of the transformer increases exponentially as the output power requirement increases above 5 W. Secondly, linear regulators are limited to a single output voltage and as a result, an entirely separate regulator must be added for each additional output voltage. Since multiple output voltages are important for many devices, this severely limits the usefulness of a linear regulator. For example, a typical device may require 12 V for a disk drive plus 3.3 or 5 V for logic circuits (sometimes both). Additionally, linear power supplies operate at only 30–60% efficiency, making it necessary to have a large linear transformer plus a large heatsink to the pass transistor. These shortcomings increase both the cost and size of the power supply.

Switching mode power supplies yield operating efficiencies in the 68–90% range. (Switching power supplies which exceed 80% efficiency are typically DC-DC units. In common practice, AC-DC models operate in the 68–75% efficiency range.) The power transistors used in switching power supplies deliver many times their power rating to the load and the circuit allows for multiple outputs from a single transformer. In addition, the operating frequency is much greater than 60 Hz, allowing designers to use many smaller components. All of this makes a switching power supply smaller and less costly than a linear regulated model with comparable output, particularly for power levels above about 5 W. However, even the best switching power supplies available before the present invention were too low current or too large to be as compact as the present device and thus suffer from the size problems discussed above.

The new device of this invention overcomes these problems by providing a compact, light weight, high output power supply that can be completely incorporated in a slightly oversize plug body.

SUMMARY OF THE INVENTION

The invention described herein is a high-efficiency, universal AC input, switching power supply which achieves a four-fold increase in output wattage over comparably sized, linear regulated power supply wall adapters. It's features include a compact size, which enables all outlets on a standard 2- or 4-outlet wall receptacle to be utilized.

The compact power supply features a package with an included volume of less than about 250 cubic centimeters, a switching power supply contained in said package, said power supply capable of providing more than about 5 watts of power, and connections from input power to and for output from the power supply. The power supply can be configured on three circuit boards, in a U-shaped configuration. The boards may be partially or fully potted to provide improved thermal performance and safety. The electronic components are carefully selected and matched for maximum output performance.

One object of the invention is to provide a compact, high output power supply.

Another object of the invention is to provide a power supply small enough to allow all adjacent AC sockets in a standard wall outlet to be used simultaneously while the power supply is plugged in.

DESCRIPTION OF THE PREFERRED EMBODIMENTS

Figure 2A:
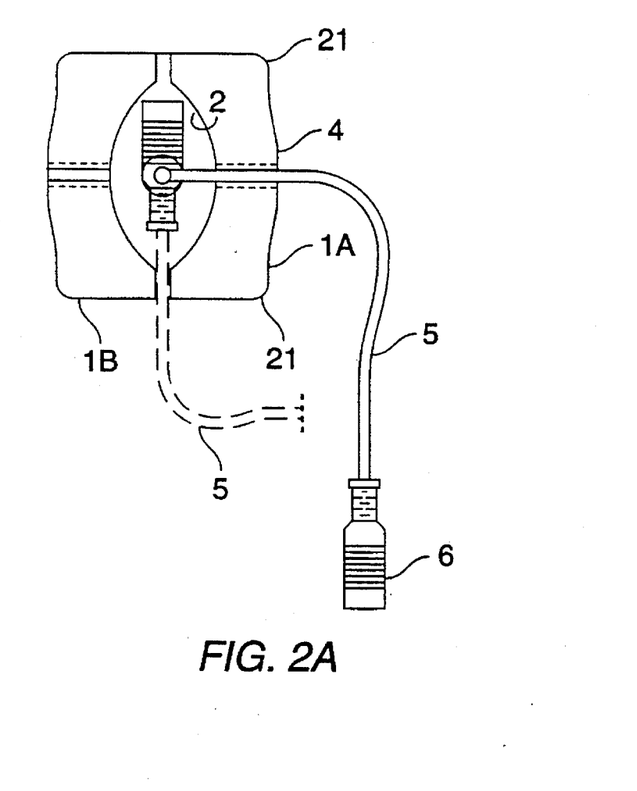
FIGS. 2A, 2B, 2C and 2D illustrate several views of one preferred embodiment of the invention.
Figure 2B:
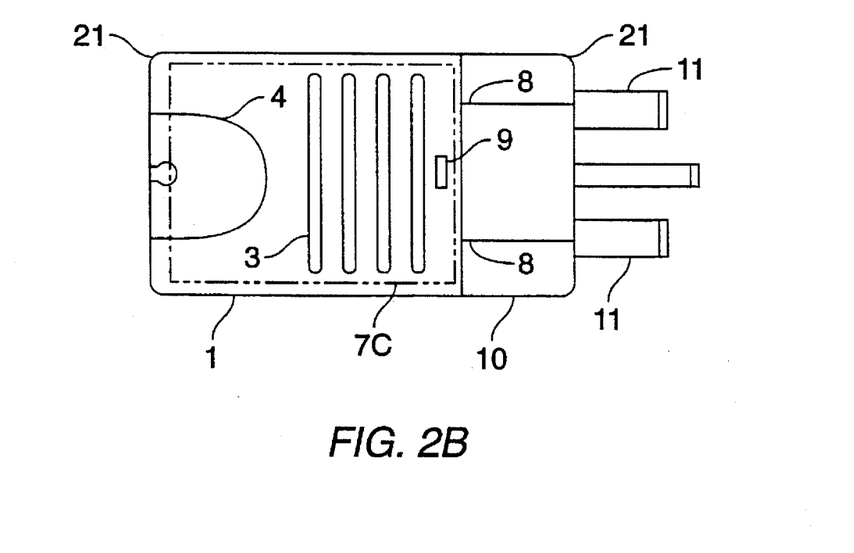
Figure 2C:
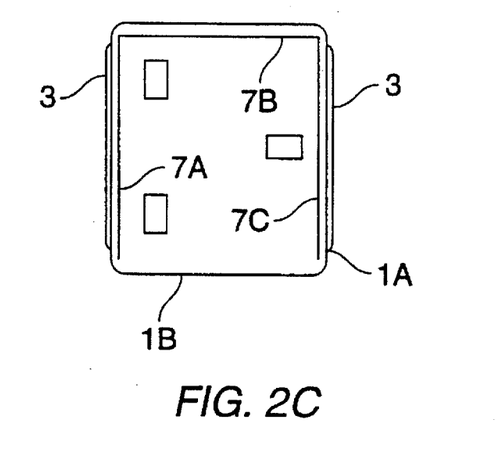
Figure 2D:
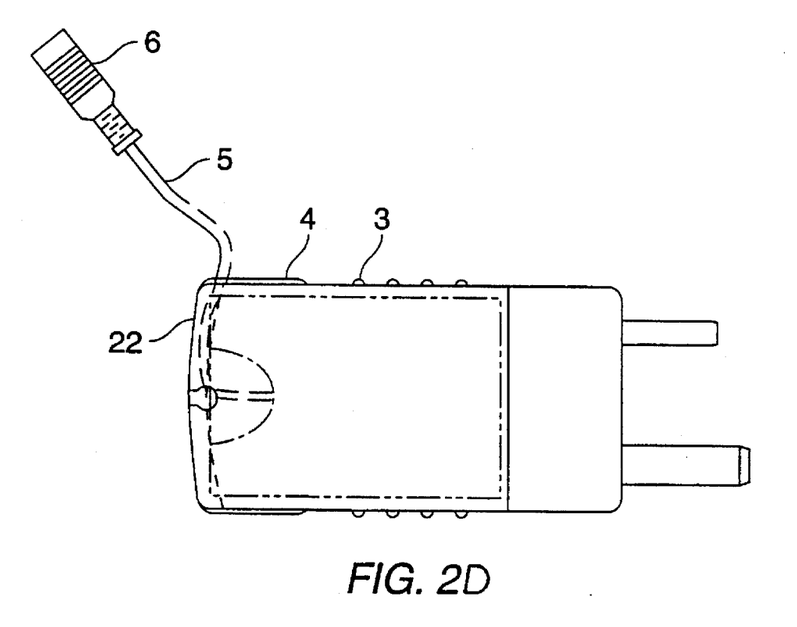
Figure 3A:
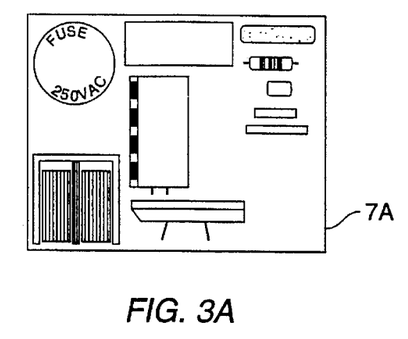
FIGS. 3A, 3B and 3C illustrate representative components on each of the circuit boards.
Figure 3B:
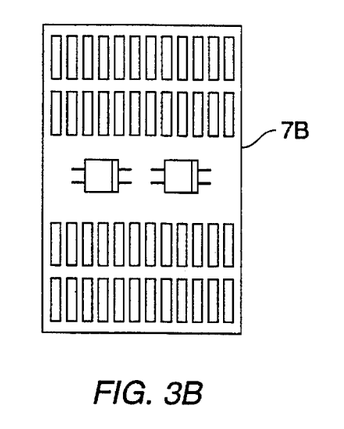
Figure 3C:
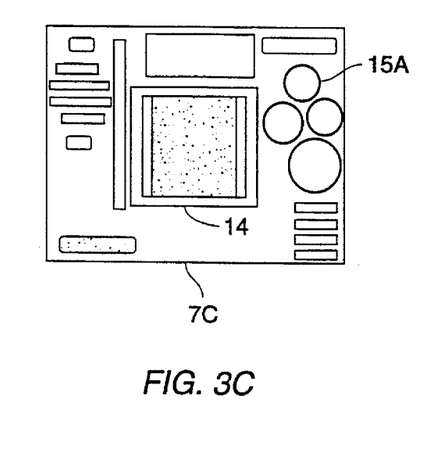

In the new power supply, a high efficiency switching mode power supply is placed into a package approximately the size of a standard wall plug. In a preferred embodiment, this is accomplished by mounting three circuit boards, 7A, 7B, 7C, set 90° apart to form a rectangular "U" shape with three open sides as shown in FIG. 2C. Two boards 7A, 7C have maximum dimensions of 50 mm×38 mm while center board 7B has maximum dimensions of 32 mm×38 mm. The boards, which together comprise the entire power supply, utilize surface mount components and IC's to achieve a high density package. FIGS. 3A, 3B and 3C illustrate one preferred configuration of components. In a preferred embodiment, most or all of the components are mounted on one side of each board.

Referring to FIGS. 2A, 2B, 2C and 2D, in a preferred embodiment, boards 7A, 7B and 7C are mounted within casing 1. The component side of each board can be oriented to face "into" the "U" configuration, that is, the component side of each board faces the component side of each other board. Casing 1 preferably has outside dimensions of about 55 mm×43 mm×40 mm, a volume of about 95 cc. Circuit boards 7A, 7B and 7C occupy only a portion of this volume, and the remaining space can be used for other design features, such as plug storage cavity 2. Casing 1 is preferably formed from top half 1A and bottom half 1B, which may be joined by any of a number of methods well known in the art, including snap-fitting, gluing and ultrasonic welding. Plug 10 with prongs 11 may be permanently secured to or integrated with casing 1 or may be detachably secured by a variety of methods, as further described below. Prongs 11 are electrically connected through leads 8 to isolation transformer 14 on one of circuit boards 7A, 7B and 7C. Output leads 5A connect to cable 5 and ultimately to power adapter plug 6 to provide power to an electrical device (not shown).

In a preferred embodiment, plug 10 is 20 mm long for an overall case length of 75 mm, and prongs 11 are 18 mm long for an overall device length of 93 mm. An alternative embodiment incorporates plug 10 into casing 1 to provide a total case length of 55 mm and overall length of 73 mm.

The overall package size preferably is less than about 250 cubic centimeters, more preferably less than about 200 cubic centimeters and still more preferably less than about 125 cubic centimeters. One particularly preferred embodiment has outside dimensions of 42 mm×54 mm×75 mm (170 cc), including case 1 and plug 10. An alternative embodiment with an integrated plug has outside dimensions of 42 mm×54 mm×55 mm (125 cc).

Casing 1 can be modified with enhancements such as ridges 3 (e.g., 1 mm high, 1–2 mm wide) and grip 4 (e.g., 3 mm high, radius 20 mm). In one preferred embodiment, the edges 21, rear 22 and top/bottom surfaces 23 of casing 1 are rounded (radii 3 mm, 197 mm and 365 mm, respectively).

The power supply output preferably is more than about 10 W, more preferably more than about 15 W and still more preferably about 20 W.

One or more LED's 9 can be incorporated into the package. Referring to FIG. 2B, multicolored LED 9 is mounted to the surface of circuit board 7B to show through an opening in case 1. One color of LED display can be selected to indicate that power is available in the device, while another color can be used to indicate that the load exceeds the capacity of the device and the delivered voltage may not be within specifications.

The power supply is encapsulated (potted) to provide adequate safety for the user and to provide thermal management. A variety of potting methods and materials are known in the art and can be used to practice the present invention. One preferred method for potting uses a vacuum vibration potting machine to help distribute the potting material completely and avoid trapped air bubbles. Trapped air bubbles tend to fatigue the power supply as a result of the differing thermal expansion coefficient. Vacuum vibration reduces or eliminates bubbles, thereby assuring a long life and safe operation. Several vendors can provide vacuum potting services, including Anam Instruments, Co., Inchon, Korea.

In a preferred embodiment, the potting materials consist of a mixture of epoxy resin and a hardener. The combined material, which is non-corrosive to copper, cures at room temperature. It is non-exotherming, easy to apply, and has a long working life before setting up. Its thermal conductivity of 0.105 BTU-ft/ft$^2$-hr-°F. is about five times greater than that of air. It has a high dielectric strength (700 V/mil) which allows higher component densities than air cooled designs and a high volume resistivity ($4.1 \times 10^{14} \Omega$/cm) ensuring that potted components won't short. The primary ingredients of the potting compound are:

Part A—Amine curative 90–99%; Benzyl Alcohol 1–10%;

Part B—Epoxy Resin 90–99%; Carbon Black 1–10%.

In one preferred embodiment, the potting material fills the entire contained volume of casing 1. In an alternative preferred embodiment, the potting material partially fills the contained volume of casing 1. This could be done in several orientations. In a preferred orientation, the casing is oriented so board 7C is down and the volume is filled so the components on board 7C are fully encapsulated and some of the components on boards 7A and 7B are encapsulated. In general, the circuit designer can position the most temperature sensitive components on board 7C to use this technique to best advantage. Viewed another way, the temperature sensitive components can be positioned preferably on any one of the circuit boards, and that board can then be fully encapsulated while the others are only partially encapsulated. This partially potted embodiment provides both cost and weight reductions over a fully potted version.

The compact power supply can be configured advantageously in combination with two novel packaging techniques. The case design allows for the power output cable to be positioned at right angle to the power supply. This feature, which is especially useful in tight environments such as behind a desk, is accomplished by incorporating a notch molded into the output end of the device as shown on FIG. 2A. In addition, the entire output cable is designed to be wrapped around the power supply during storage with the output plug fitted into the recess at the bottom of the power supply which also forms the notch. The cable feature is more fully described in the copending, commonly-owned patent application entitled POWER CORD SECURING AND STORAGE DEVICE, fried simultaneously herewith (no Serial No. yet assigned).

Universal application of the power supply is accomplished through the use of interchangeable input connectors which allow the user to select the appropriate input plug for the nation in which it is being used. The interchange of input plugs is accomplished through the use of either a bayonet mount or a dovetail mount. The interchangeable plug feature is more fully described in the copending, commonly-owned patent application entitled INTERCHANGEABLE PLUG DEVICE FOR POWER SUPPLY, filed Apr. 26, 1994 (no Serial No. yet assigned), which in turn is a continuation-in-part of copending, commonly-owned application Ser. No. 08/201,397, entitled INTERCHANGEABLE PLUG DEVICE FOR BATTERY CHARGER, filed Feb. 24, 1994.

Figure 1:
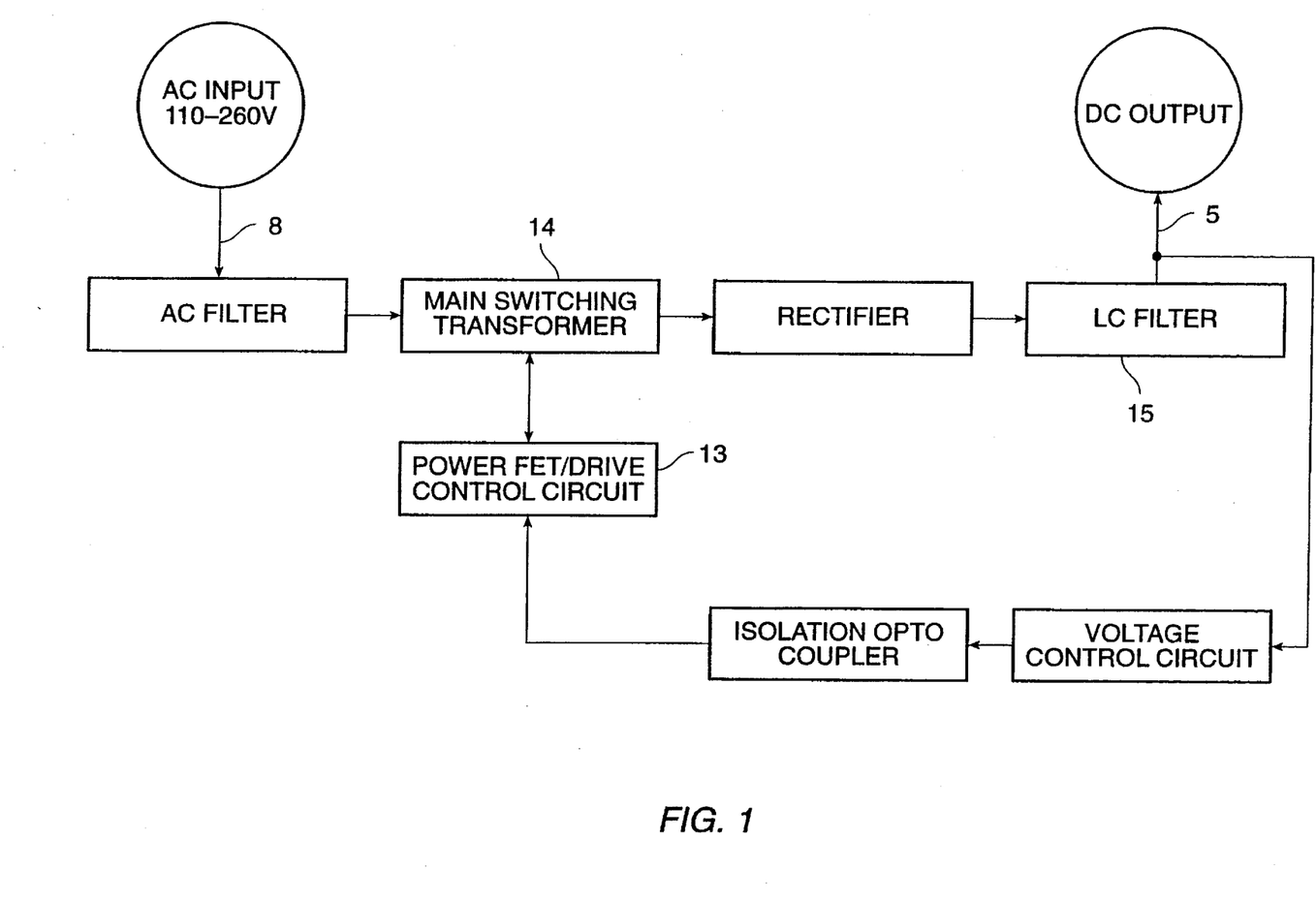
FIG. 1 illustrates a block diagram of the switching power supply of this invention.

The inventors are unaware of any prior art device equivalent to or even close to the output/size ratio of this power supply. Compared to a similarly sized linear regulated power supply, the present device achieves a 275% increase in output, yielding 20 W, in a package that is nominally 55 mm×43 mm×40 mm, less than 40% larger in size. This has been accomplished through the following techniques:

1. High Operating Frequencies—Typically, switching power supplies operate in the 30–80 KHz range. In the new device, switching at 100+ KHz and above allows use of smaller filter 15 (FIG. 1) components such as filter choke 15A (FIG. 3C), and to reduce the size of switching transformer 14 (FIGS. 1 and 3C).

2. Reducing the Leakage Inductance in the Transformer—The present invention uses a tightened winding of the transformer to reduce leakage inductance. This also allows us to get more windings in the same volume. This increases the coupling coefficient and thus reduces the leakage inductance. Use of triple-insulated wire allows still tighter winding and additional improvements in coupling coefficient and leakage inductance.

3. Sandwich Transformer Windings—To improve coupling coefficient.

4. Improved Thermal Management—Potting of power supply (not usually done on any switching power supplies) allows reduction of the clearance and creepage distances required by safety agencies. A conventional transformer has approximately 3 mm of tape on each inside edge of the bobbin, in order to meet safety creepage distance requirements. The new, encapsulated power supply can use a transformer with only 1.5 mm tape, providing more winding area.

5. Use of power management I/C's allows for the use of lower external component count. Power FET 13 provides a lower resistance between drain and source compared to Power BiPolar junction transistors, which are more commonly used. This allows use of high switching speeds in the new device.

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. A compact power supply comprising a package with an included volume of less than about 250 cubic centimeters, a switching power supply contained in said package for providing mole than about 5 watts of power, said power supply comprising a plurality of circuit boards positioned relative to one another to form a substantially "U" shape in said package, means to connect to and supply input power to said switching power supply, and means to connect to output power from said switching power supply.

2. The compact power supply of claim 1 wherein said switching power supply further comprises a plurality of electronic components surface mounted to a circuit board in said package.

3. The compact power supply of claim 1 wherein said switching power supply switches at frequencies greater than or equal to 100 KHz.

4. The compact power supply of claim 1 wherein said contained volume is less than about 95 cubic centimeters.

5. A compact power supply comprising:
a package with an included volume of less than about 250 cubic centimeters,
a switching power supply contained in said package, for supplying more than about 5 watts of power, said switching power supply comprising a plurality of circuit boards including a first and a second circuit board, each of which is secured at about a 90° angle to a third circuit board to form a "U" shape in said package,
means to connect to and supply input power to said switching power supply, and
means to connect to output power from said switching power supply.

6. The compact power supply of claim 5 wherein each of said first and second circuit boards have maximum dimensions of about 25 by 55 mm and said third circuit board has maximum dimensions of about 35 by 55 mm.

7. A compact power supply comprising:
a package with an included volume of less than about 250 cubic centimeters,
a switching power supply contained in said package, said power supply capable of providing more than about 5 watts of power,
means to connect to and supply input power to said switching power supply and
means to connect to output power from said switching power supply, wherein said switching power supply is fully potted in said package.

8. A compact power supply comprising:
a package with an included volume of less than about 250 cubic centimeters,
a switching power supply contained in said for supplying more than about 5 watts of power,
means to connect to and supply input power to said switching power supply and
means to connect to output power from said switching power supply wherein said switching power supply is partially potted in said package.

9. A compact power supply comprising:
a package with an included volume of less than about 250 cubic centimeters,
a switching power supply contained in said package for supplying more than about 5 watts of power, and comprising a transformer with total creepage clearance less than about 3 millimeters, whereby said transformer includes a maximum winding area and operates efficiently
means to connect to and supply input power to said switching power supply and
means to connect to output power from said switching power supply.

10. A compact power supply comprising:
a package with an included volume of less than about 250 cubic, centimeters,
a switching power supply contained in said for supplying more than about 5 watts of power,
means to connect to and supply input power to said switching power supply and
means to connect to output power from said switching power supply, and
an indicator LED connected to said switching power supply to indicate operational status.

11. Two compact power supplies comprising:
a first compact power supply plugged into a first one of two sockets in a duplex wall socket and a second compact power supply plugged into the second one of two sockets in said duplex wall socket, each of said compact power supplies comprising:
a package with an included volume of less than about 250 cubic centimeters,
a switching power supply contained in said package for supplying more than about 5 watts of power,
means to connect to and supply input power to said switching power supply and
means to connect to output power from said switching power supply.

12. Four compact power supplies comprising:
a first compact power supply plugged into a first one of four sockets in a four-way wall socket and
each of the second, third and fourth compact power supplies plugged into a corresponding second, third and fourth socket in said four-way wall socket, each of said compact power supplies comprising:
a package with an included volume of less than about 250 cubic centimeters,
a switching power supply contained in said package for supplying more than about 5 watts of power,
means to connect to and supply input power to said switching power supply and
means to connect to output power from said switching power supply.

13. Two compact power supplies comprising:
a first compact power supply plugged into a first one of four sockets in a four-way wall socket and
a second compact power supplies plugged into a second socket in said four-way wall socket, said second socket vertically adjacent to said first socket, each of said compact power supplies comprising:
a package with an included volume of less than about 250 cubic centimeters,
a switching power supply contained in said package for supplying more than about 5 watts of power,
means to connect to and supply input power to said switching power supply and
means to connect to output power from said switching power supply.

14. A compact power supply comprising
a package with an included volume of less than about 250 cubic centimeters,
a switching power supply contained in said package for providing more than about 5 watts of power, said switching power supply comprising
a plurality of circuit boards including a first and a second circuit board, each of which is secured at about a 90° angle to a third circuit board to form a "U" shape in said package
each of said first and second circuit boards having maximum dimensions of about 25 by 55 mm and said third circuit board having maximum dimensions of about 35 by 55 mm,
means to connect to and supply input power to said switching power supply, and
means to connect to output power from said switching power supply.

* * * * *

UNITED STATES PATENT AND TRADEMARK OFFICE
CERTIFICATE OF CORRECTION

PATENT NO. : 5,568,365

DATED : October 22, 1996

INVENTOR(S) : Hahn et al.

It is certified that error appears in the above-identified patent and that said Letters Patent is hereby corrected as shown below:

In column 2, line 6, delete "two, parallel" and insert therefor --two parallel,--.

In column 3, line 41, delete "It's" and insert therefor --Its--.

In column 4, line 27, delete "40 mm," and insert therefor --40 mm and--.

In column 5, line 49, after "at" insert --a--.

In column 5, line 58, delete "fried" and insert therefor --filed--.

In column 5, lines 58-59, delete "(no Serial No. yet assigned)." and insert therefor --and now issued as U.S. Patent No. 5,507,667."

In column 6, lines 1-2, delete "1994 (no Serial No. yet assigned), and insert therefor --1994, now abandoned,".

In column 6, line 56, delete "mole" and insert therefor --more--.

In column 7, line 37, after "said" insert --package--.

In column 7, line 61, after "said" insert --package--.

UNITED STATES PATENT AND TRADEMARK OFFICE
CERTIFICATE OF CORRECTION

PATENT NO. : 5,568,365

DATED : October 22, 1996

INVENTOR(S) : Hahn et al.

It is certified that error appears in the above-indentified patent and that said Letters Patent is hereby corrected as shown below:

In column 8, line 35, delete "supplies" and insert therefor --supply--.

Signed and Sealed this

Seventh Day of October, 1997

Attest:

BRUCE LEHMAN

Attesting Officer     Commissioner of Patents and Trademarks